United States Patent
McTaggart et al.

(10) Patent No.: US 11,869,941 B2
(45) Date of Patent: Jan. 9, 2024

(54) VERTICAL BIPOLAR JUNCTION TRANSISTOR AND METHOD

(71) Applicant: GlobalFoundries U.S. Inc., Malta, NY (US)

(72) Inventors: Sarah A. McTaggart, Essex Junction, VT (US); Rajendran Krishnasamy, Essex Junction, VT (US); Qizhi Liu, Lexington, MA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/679,166

(22) Filed: Feb. 24, 2022

(65) Prior Publication Data

US 2023/0268394 A1 Aug. 24, 2023

(51) Int. Cl.
| | |
|---|---|
| *H01L 21/265* | (2006.01) |
| *H01L 29/732* | (2006.01) |
| *H01L 29/737* | (2006.01) |
| *H01L 29/08* | (2006.01) |
| *H01L 29/66* | (2006.01) |

(52) U.S. Cl.
CPC .... *H01L 29/0817* (2013.01); *H01L 21/26586* (2013.01); *H01L 29/66272* (2013.01); *H01L 29/732* (2013.01); *H01L 29/7371* (2013.01)

(58) Field of Classification Search
None
See application file for complete search history.

(56) References Cited

U.S. PATENT DOCUMENTS

| | | |
|---|---|---|
| 5,286,661 A | 2/1994 | de Fresart et al. |
| 6,940,149 B1 * | 9/2005 | Divakaruni ......... H01L 29/0649 438/340 |
| 7,329,941 B2 | 2/2008 | Chidambarrao et al. |
| 8,067,290 B2 | 11/2011 | Boeck et al. |

(Continued)

OTHER PUBLICATIONS

Cressler et al., "Proton Radiation Response of SiGe HBT Analog and RF Circuits and Passives," IEEE Transactions on Nuclear Science, 2002, pp. 1-6.

(Continued)

*Primary Examiner* — Xiaoming Liu
(74) *Attorney, Agent, or Firm* — Francois Pagette; Hoffman Warnick LLC

(57) ABSTRACT

Disclosed are a structure including a transistor and a method of forming the structure. The transistor includes an emitter region with first and second emitter portions. The first emitter portion extends through a dielectric layer. The second emitter portion is on the first emitter portion and the top of the dielectric layer. An additional dielectric layer covers the top of the second emitter portion. The second emitter portion and the dielectric and additional dielectric layers are wider than the first emitter portion. At least a section of the second emitter portion is narrower than the dielectric and additional dielectric layers, thereby creating cavities positioned vertically between edge portions of the dielectric and additional dielectric layers and positioned laterally adjacent to the second emitter portion. The cavities are filled with dielectric material or dielectric material blocks the side openings to the cavities creating pockets of air, of gas or under vacuum.

18 Claims, 13 Drawing Sheets

(56) References Cited

U.S. PATENT DOCUMENTS

| | | | |
|---|---|---|---|
| 9,070,734 | B2 | 6/2015 | Camillo-Castillo et al. |
| 9,159,817 | B2 | 10/2015 | Castillo-Castillo et al. |
| 9,245,951 | B1 | 1/2016 | Camillo-Castillo et al. |
| 9,318,551 | B2 | 4/2016 | Camillo-Castillo et al. |
| 9,368,608 | B1 | 6/2016 | Camillo-Castillo et al. |
| 10,211,090 | B2 | 2/2019 | Stamper et al. |
| 10,468,508 | B2 | 11/2019 | Gauthier et al. |
| 10,469,035 | B2 | 11/2019 | Zheng et al. |
| 2008/0203490 | A1* | 8/2008 | Feilchenfeld ....... H01L 29/7302 257/E29.174 |
| 2017/0236923 | A1 | 8/2017 | Chevalier |
| 2018/0102422 | A1* | 4/2018 | Stamper ............ H01L 29/66287 |

OTHER PUBLICATIONS

Khater et al., "SiGe HBT Technology with fmax/fT = 350/300 GHz and Gate Delay Below 3.3 ps," Electron Devices Meeting, IEDM 1988, Technical Digest, International, 2005, pp. 1-4.

Rucker et al., Silicon-Germanium Heterojunction Bipolar Transistors for mm-Wave Systems: Technology, Modeling and Circuit Applications, Chapter 1, SiGe HBT Technology, Published by River Publishers, Edited by Niccolo Rinaldi and Michael Schroter in 2018, pp. 11-54.

European Search Report dated Jul. 24, 2023 for Application 22205699.6; Reference EP142404-A9249fib; pp. 9.

* cited by examiner

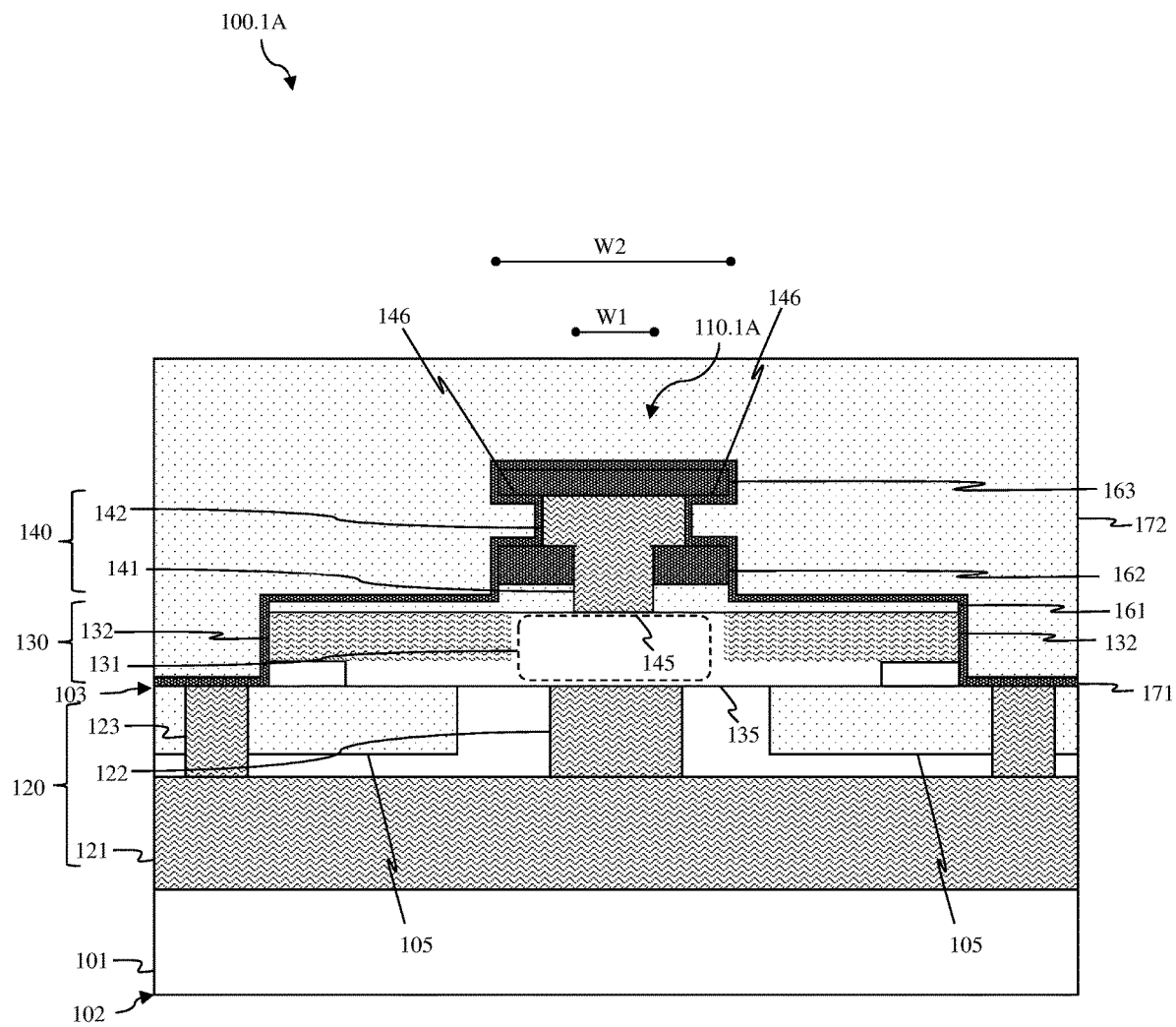
FIG. 1.1A

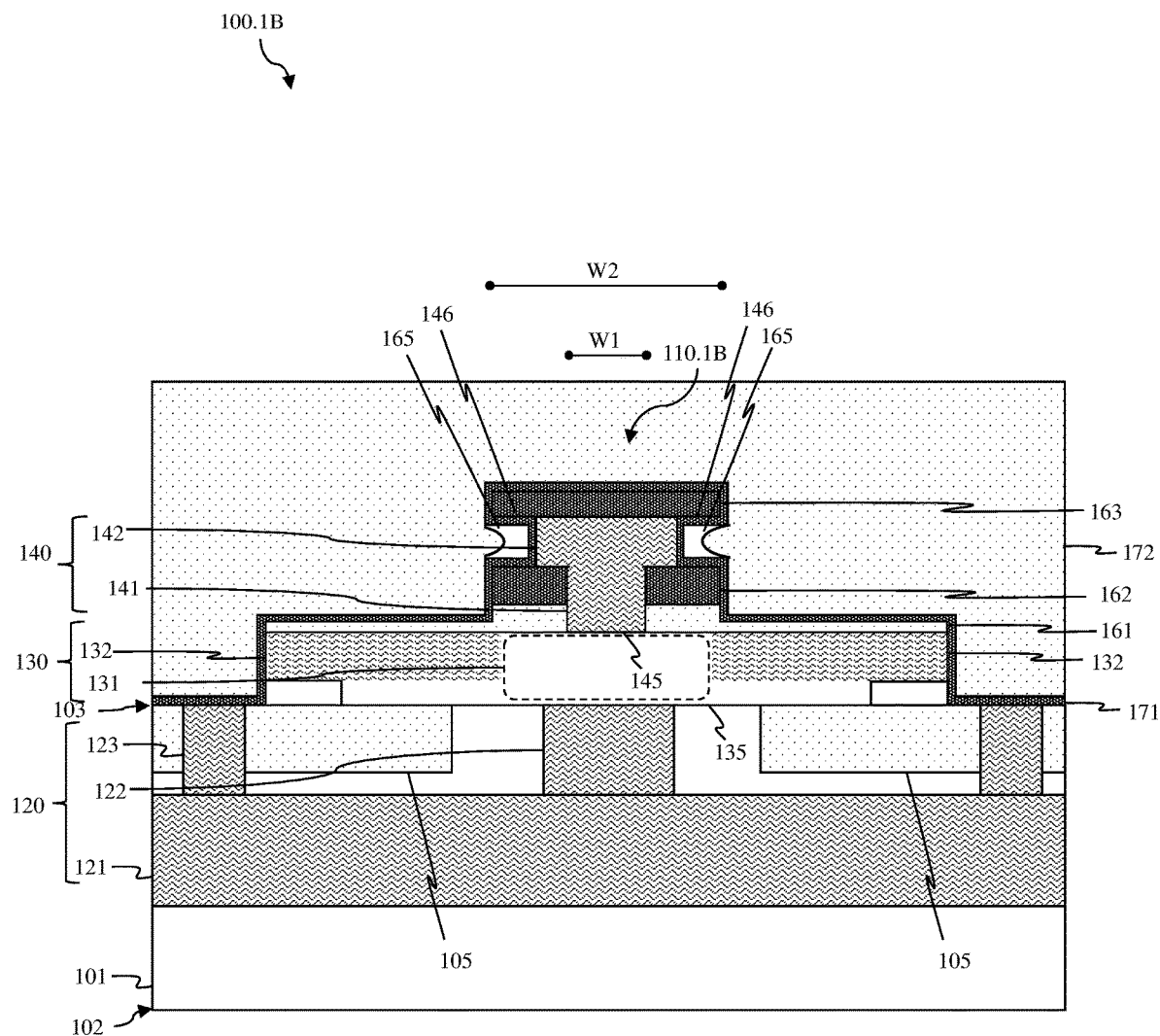
FIG. 1.1B

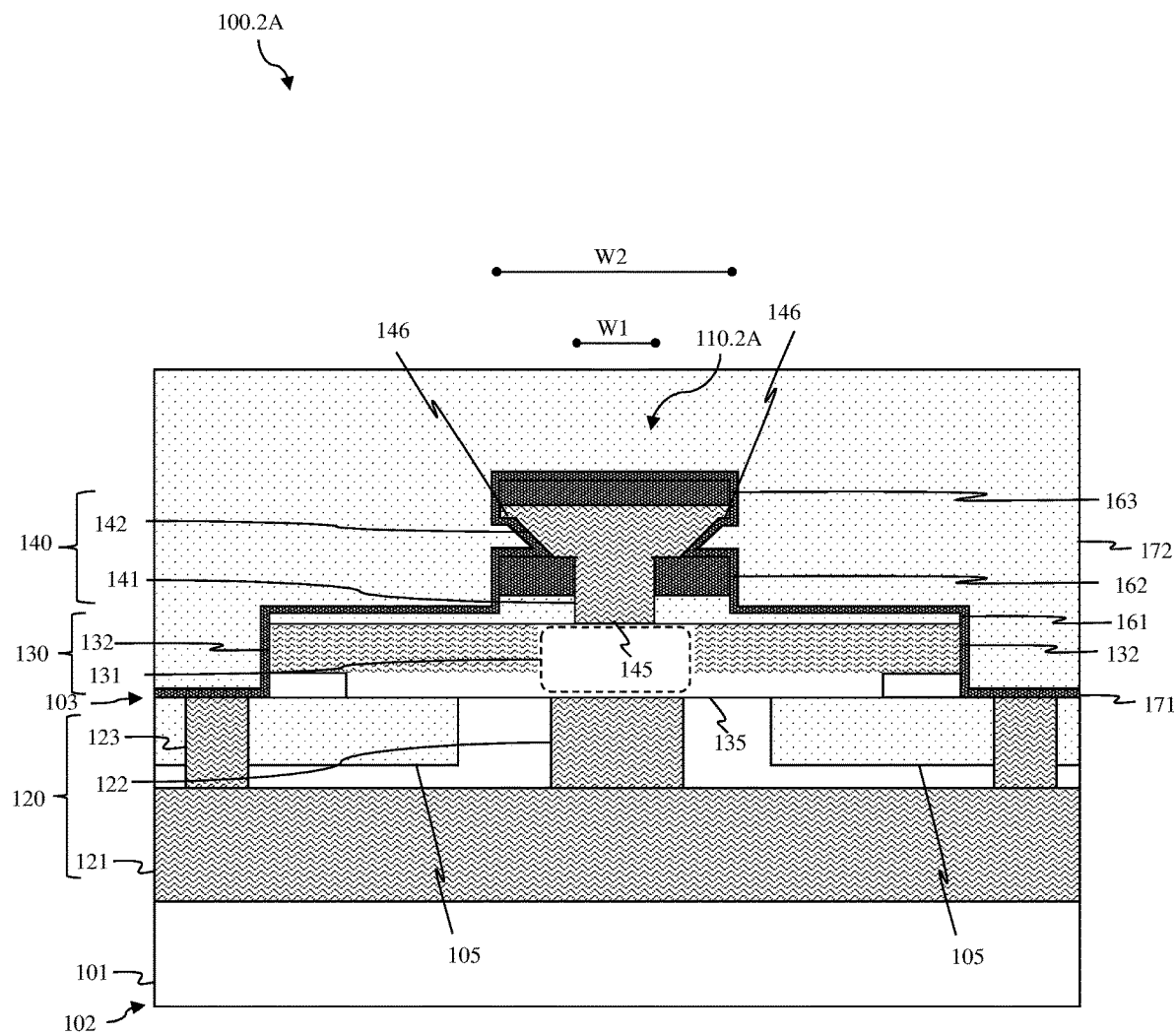
FIG. 1.2A

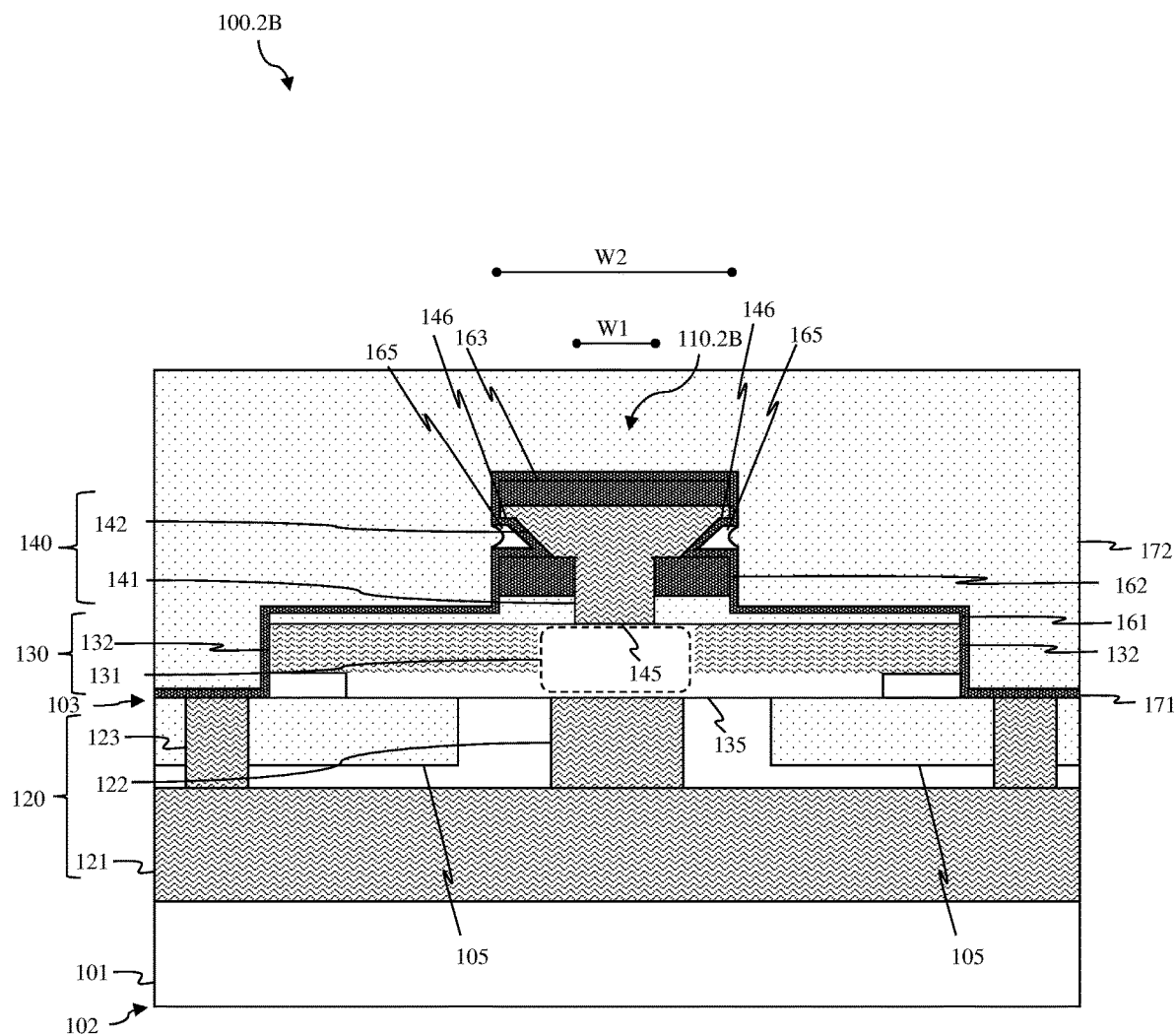
FIG. 1.2B

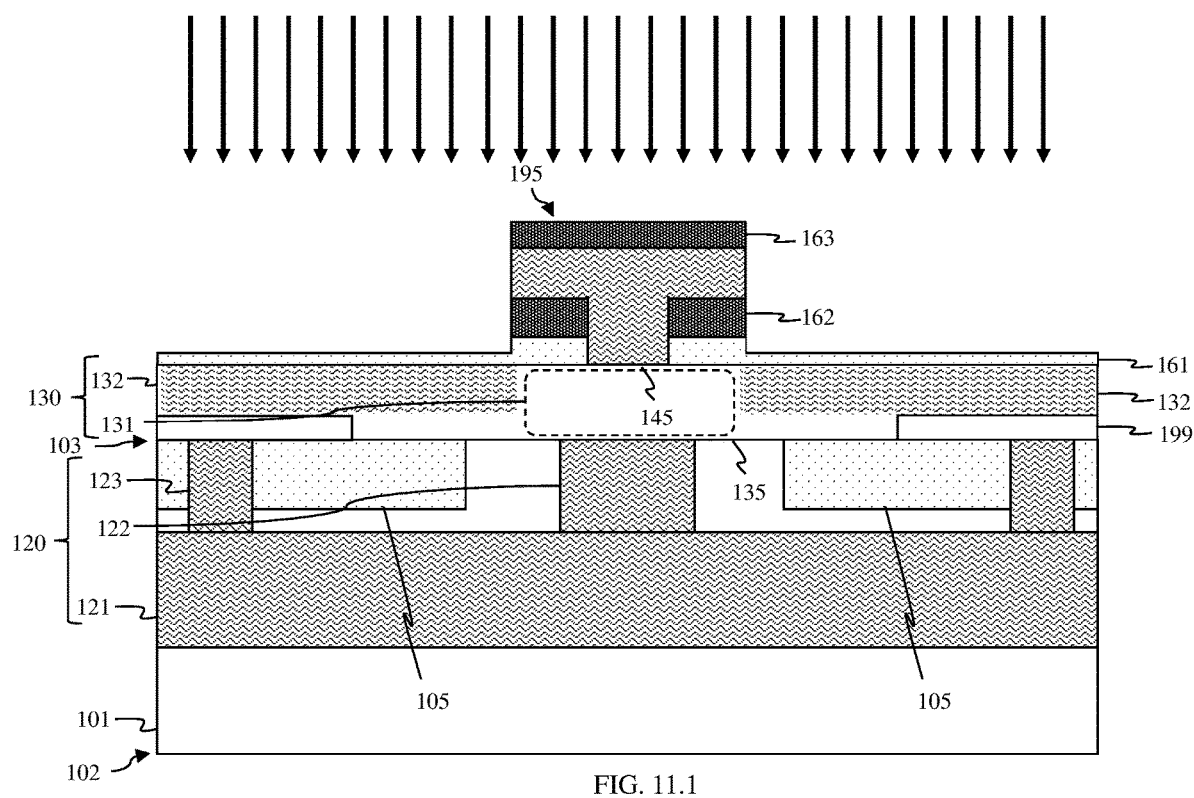
FIG. 11.1

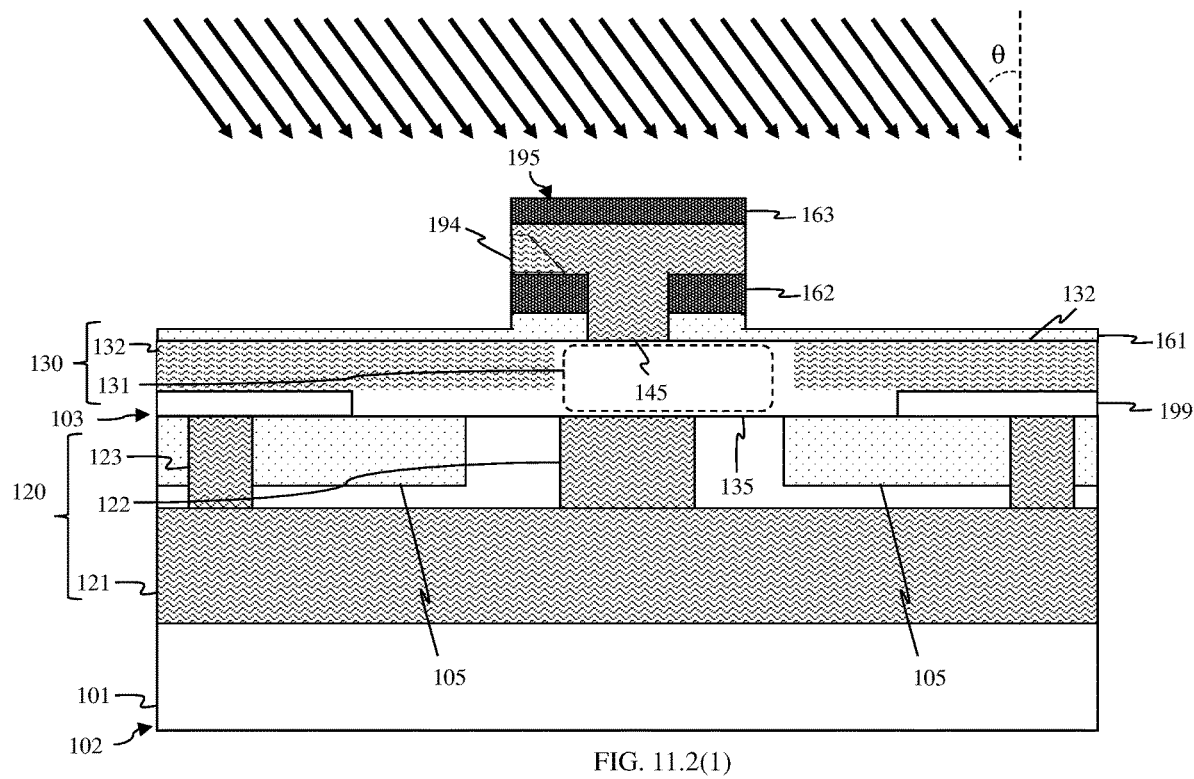
FIG. 11.2(1)
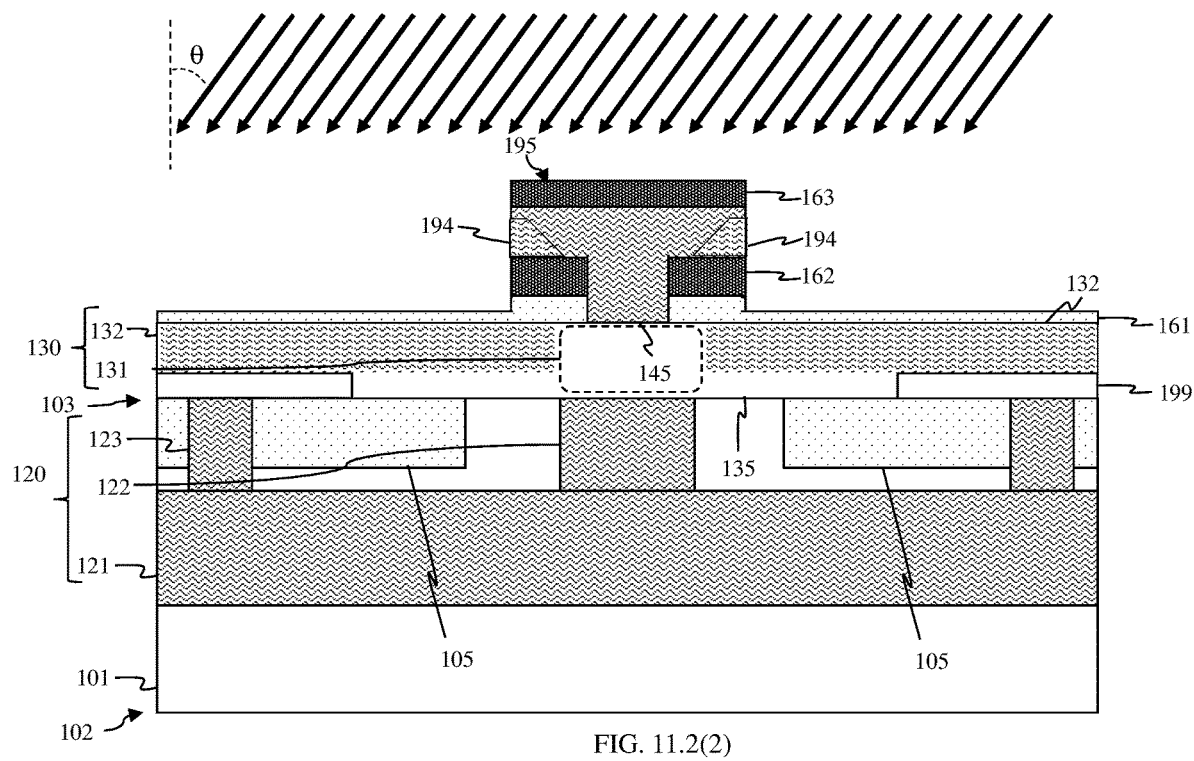
FIG. 11.2(2)

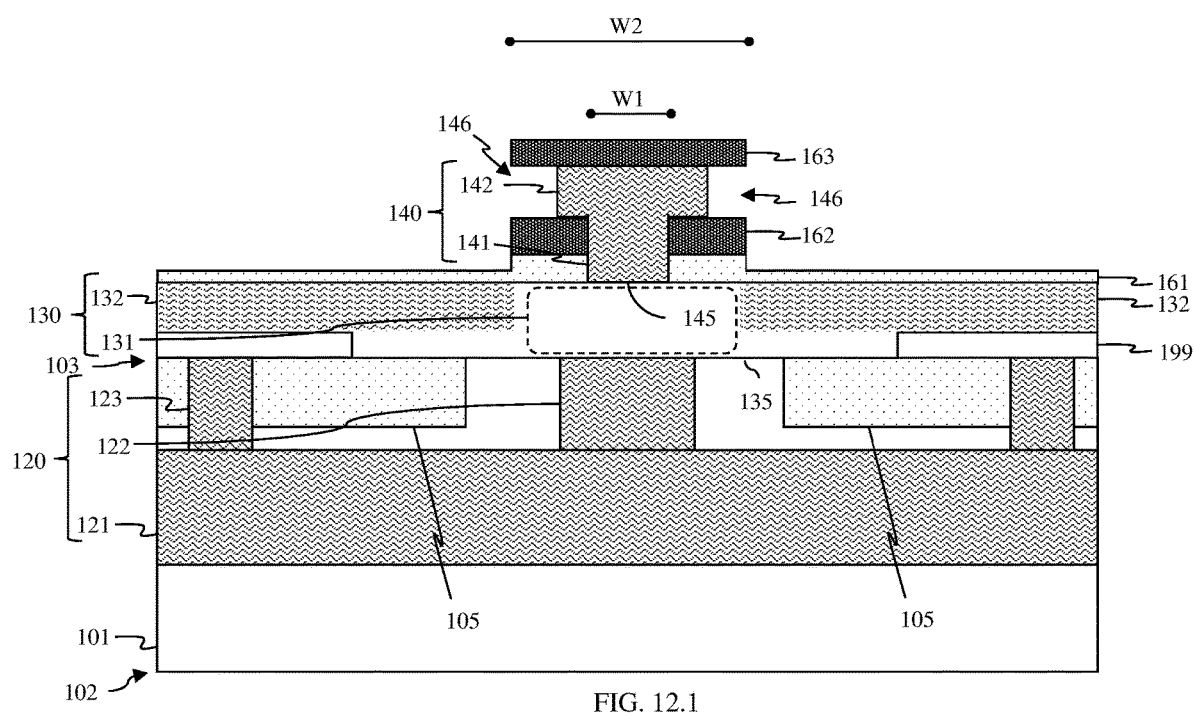
FIG. 12.1

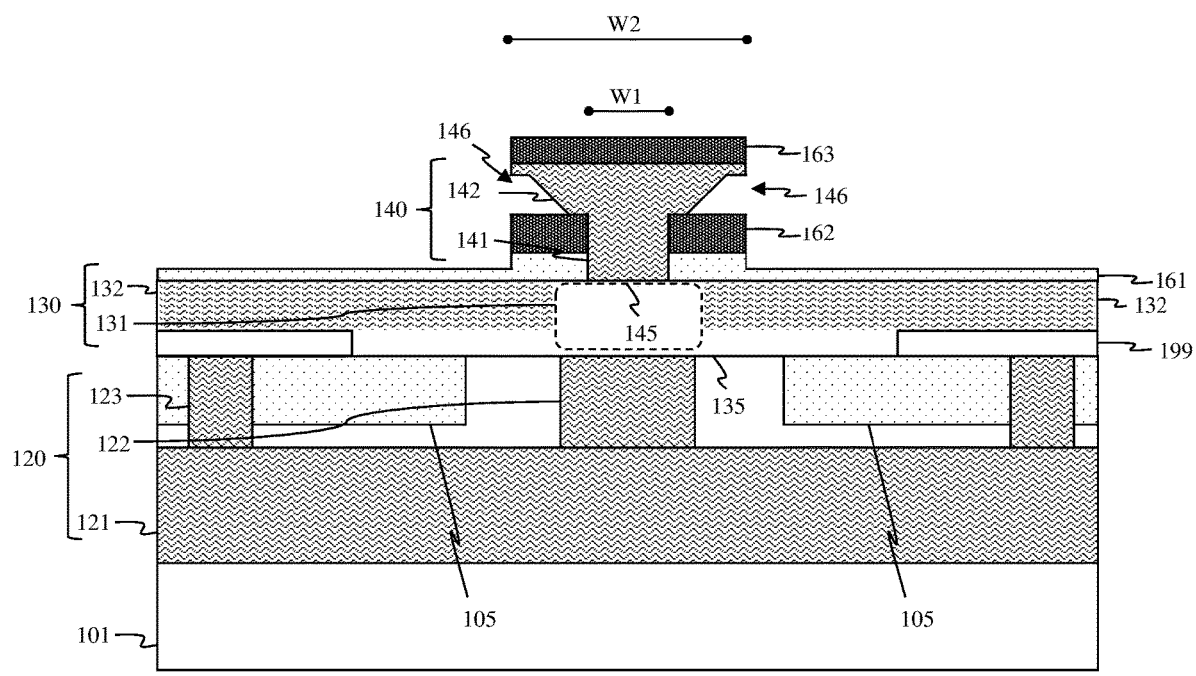
FIG. 12.2

VERTICAL BIPOLAR JUNCTION TRANSISTOR AND METHOD

BACKGROUND

Field of the Invention

The present invention relates to semiconductor structures and, more particularly, to embodiments of a semiconductor structure and a method of forming the semiconductor structure.

Description of Related Art

Power amplifiers (PAs) and low-noise amplifiers (LNAs), such as those used in radio frequency (RF) applications, typically incorporate bipolar junction transistors (BJTs). Performance (e.g., linearity and gain) of PAs and LNAs can be improved, for example, by increasing the BJT cut-off frequency (fT). fT can be increased by decreasing the base-emitter capacitance (Cbe). Unfortunately, in bipolar junction transistor (BJT) design (including in non-heterojunction BJT design and in heterojunction bipolar transistor (HBT) design) techniques used to decrease Cbe typically result in a larger device size, an increase in some other parasitic, and/or degradation of some other performance metric (e.g., maximum oscillation frequency (fmax) or breakdown voltage (BV)).

SUMMARY

Disclosed herein are embodiments of a semiconductor structure. In each of the embodiments, the semiconductor structure can include a bipolar junction transistor (BJT), such as a non-heterojunction BJT or a high performance heterojunction bipolar transistor (HBT), with reduced base-emitter capacitance (Cbe).

Specifically, some embodiments of a semiconductor structure disclosed herein can include a dielectric layer. The semiconductor structure can further include an emitter region. The emitter region can include a first emitter portion and a second emitter portion. Specifically, the first emitter portion can extend essentially vertically through the dielectric layer. The second emitter portion can be on the first emitter portion and can further extend laterally onto the dielectric layer. The semiconductor structure can further include an additional dielectric layer on the second emitter portion. The dielectric layer, the second emitter portion, and the additional dielectric layer can be wider than the first emitter portion. Additionally, at least a section of the second emitter portion can be narrower in width than the dielectric layer and the additional dielectric layer.

Other embodiments of a semiconductor structure disclosed herein can include a dielectric layer. The semiconductor structure can further include an emitter region. The emitter region can include a first emitter portion and a second emitter portion. Specifically, the first emitter portion can extend essentially vertically through the dielectric layer. The second emitter portion can be on the first emitter portion and can further extend laterally onto the dielectric layer. The semiconductor structure can further include an additional dielectric layer on the second emitter portion. The dielectric layer, the second emitter portion, and the additional dielectric layer can be wider than the first emitter portion. Additionally, at least a section of the second emitter portion can be narrower in width than the dielectric layer and the additional dielectric layer and can further increase in width between the dielectric layer and the additional dielectric layer.

In each of the above-describe structure embodiments, due to the smaller width of the second emitter portion (or section thereof) as compared to the widths of the dielectric and additional dielectric layers, cavities are positioned vertically between edge portions of the dielectric and additional dielectric layers and further positioned laterally adjacent to sidewalls of the second emitter portion. To decrease Cbe, these cavities can be filled with dielectric material or dielectric material can block the side openings to the cavities creating, within the cavities, pockets of air, of gas or under vacuum.

Also disclosed herein are method embodiments for forming a semiconductor structure, as described above. The method can include forming an emitter stack. The emitter stack can include a dielectric layer. The emitter stack can further include an emitter region including a first emitter portion, which extends essentially vertically through the dielectric layer, and a second emitter portion, which is on the first emitter portion and which further extends laterally onto the dielectric layer. The emitter stack can further include an additional dielectric layer on the second emitter portion. The emitter stack can further be formed such that the dielectric layer, the second emitter portion, and the additional dielectric layer are wider than the first emitter portion and further such that at least a section of the second emitter portion is narrower than the dielectric layer and the additional dielectric layer. The method can further include covering the emitter stack with dielectric material.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1.1A, 1.1B, 1.2A and 1.2B are cross-section diagrams illustrating various semiconductor structure embodiments, respectively, each including a bipolar junction transistor (BJT) and, particularly, a vertical BJT;

FIG. 11.1 is a cross-section diagram illustrating a partially completed semiconductor structure formed during a single dopant implantation step at process 224 of FIG. 2;

FIGS. 11.2(1) and 11.2(2) are cross-section diagrams illustrating partially completed semiconductor structures formed during multiple dopant implantation steps at process 224 of FIG. 2;

FIG. 12.1 is a cross-section diagram illustrating a partially completed semiconductor structure formed during a selective isotropic etch of the second emitter portion of FIG. 11.1 at process 226 of FIG. 2; and FIG. 12.2 is a cross-section diagram illustrating a partially completed semiconductor structure formed during a selective isotropic etch of doped areas of the second emitter portion of FIG. 11.2(2) at process 226 of FIG. 2.

DETAILED DESCRIPTION

Figure 2:
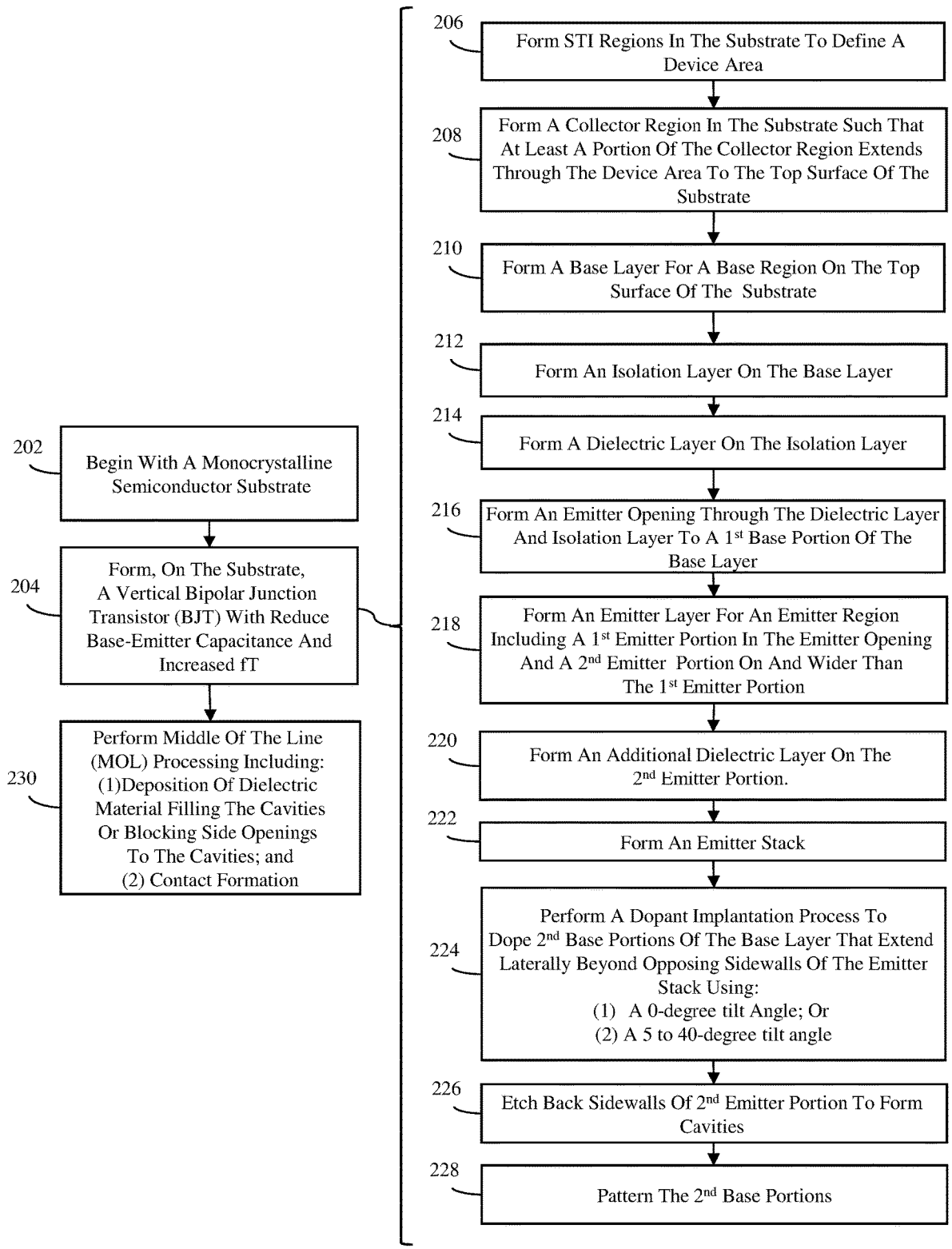
FIG. 2 is a flow diagram illustrating method embodiments for forming the semiconductor structure embodiments.

As mentioned above, in bipolar junction transistor (BJT) design (including in non-heterojunction BJT design and in heterojunction bipolar transistor (HBT) design) techniques employed to decrease base-emitter capacitance (Cbe) typically result in a larger device size, an increase in some other parasitic, and/or degradation of some other performance metric (e.g., maximum oscillation frequency (fmax) or breakdown voltage (BV)).

In view of the foregoing disclosed herein are embodiments of a semiconductor structure including a bipolar junction transistor (BJT) (e.g., a non-heterojunction BJT or a heterojunction bipolar junction transistor (HBT)) and embodiments of methods of forming the structure so that the BJT exhibits reduced base-emitter capacitance (Cbe) and increased cut-off frequency (fT) without also exhibiting significant changes in the overall BJT size, the maximum oscillation frequency (fmax), the collector-base capacitance (Ccb) or the breakdown voltage (BV) (including the emitter-base breakdown voltage (BVcbo). In the structure, the BJT can be a vertical BJT. The BJT can include a base region with a first base portion positioned laterally between second base portions. The BJT can also include a dielectric layer above the first base portion. The BJT can also include an emitter region with a first emitter portion and a second emitter portion. The first emitter portion can extend vertically through the dielectric layer to the first base portion. The second emitter portion can be on the first emitter portion and can further extending laterally onto the top surface of the dielectric layer. An additional dielectric layer can cover the top surface of the second emitter portion. The dielectric layer, the second emitter portion, and the additional dielectric layer can be wider than the first emitter portion. Additionally, at least a section of the second emitter portion can be narrower than the dielectric layer and the additional dielectric layer, thereby creating cavities, which are positioned vertically between edge portions of the dielectric layer and the additional dielectric layer and which are positioned laterally adjacent to sidewalls of the second emitter portion. To decrease Cbe, these cavities can be filled with dielectric material or dielectric material can block the side openings to the cavities creating, within the cavities, pockets of air, of gas or under vacuum.

More particularly, referring to FIGS. 1.1A, 1.1B, 1.2A and 1.2B, disclosed herein are embodiments of a semiconductor structure 100.1A, 100.1B, 100.2A, and 100.2B, respectively.

The semiconductor structure 100.1A, 100.1B, 100.2A, and 100.2B can include a monocrystalline semiconductor substrate 101 (e.g., a monocrystalline silicon substrate or a monocrystalline substrate of any other suitable semiconductor material). The monocrystalline semiconductor substrate 101 can, for example, be doped with one or more P-type dopant(s) such that it has a P-type conductivity at a relatively low conductivity level (e.g., such that the substrate 101 is a P-substrate). The semiconductor substrate 101 can have a first surface 102 (also referred to herein as a bottom surface) and a second surface 103 (also referred to herein as a top surface) opposite the first surface 102. For illustration purposes, the monocrystalline semiconductor substrate 101 is shown in FIGS. 1.1A-1.2B as being a bulk semiconductor substrate. However, it should be understood that the monocrystalline semiconductor substrate 101 could, alternatively, be a monocrystalline semiconductor layer of a semiconductor-on-insulator structure (e.g., a silicon layer of a silicon-on-insulator (SOI) structure).

The semiconductor structure 100.1A, 100.1B, 100.2A, and 100.2B can further include trench isolation regions, such as shallow trench isolation (STI) regions 105, at the top surface 103 of the semiconductor substrate 101. Specifically, the STI regions 105 can include trenches, which extend into the semiconductor substrate 101 from the top surface 103 and which are filled with one or more isolation materials (e.g., silicon dioxide or any other suitable isolation material(s)). At least some STI regions 105 can laterally surround a device area.

The semiconductor structure 100.1A, 100.1B, 100.2A, and 100.2B can further include a bipolar junction transistor (BJT) 110.1A, 110.1B, 110.2A and 110.2B. The BJT 110.1A, 110.1B, 110.2A and 110.2B can be a vertical BJT. Those skilled in the art will recognize that a BJT includes three terminals: a collector, an emitter, and a base between the collector and the emitter. In a vertical BJT, these terminals are vertically oriented (e.g., the base stacked vertically between the collector and the emitter). In any case, the base (or at least a portion thereof) can have a first-type conductivity and the collector and the emitter can have a second-type conductivity that is different from the first-type conductivity. Thus, an NPN-type BJT will include a P-type base, an N-type collector, and an N-type emitter; whereas a PNP-type BJT will include an N-type base, a P-type collector and a P-type emitter. In the disclosed embodiments, the BJT can be either a non-heterojunction BJT or a high performance heterojunction bipolar transistor (HBT). In a non-heterojunction BJT, the same semiconductor material (e.g., silicon) is used for the base, collector and emitter. In a heterojunction bipolar transistor (HBT), the collector and emitter are made, at least in part, of one semiconductor material (e.g., silicon) and the base is made, at least in part, of a different semiconductor material (e.g., silicon germanium). The use of differing semiconductor materials at the emitter-base junction and at the base-collector junction creates heterojunctions suitable for handling higher frequencies.

Whether the BJT 110.1A, 110.1B, 110.2A and 110.2B is a non-heterojunction BJT or an HBT, it is a vertical BJT. Specifically, it includes collector region 120 in the semiconductor substrate 101, an emitter region 140 above the semiconductor substrate 101, and a base region 130 including a first base portion 131 stacked vertically between the collector region 120 and the emitter region 140 and second base portions 132 on opposing sides of the first base portion 131. In the detailed description of the BJT below, reference is made to semiconductor layers and/or regions that are doped so as to have a first-type conductivity or a second-type conductivity that is different from the first-type conductivity. It should be understood that the first-type conductivity and the second-type conductivity are either P-type conductivity and N-type conductivity, respectively, or N-type conductivity and P-type conductivity, respectively, depending upon whether the BJT is an NPN-type BJT or a PNP-type BJT. Specifically, if the BJT is an NPN-type BJT, then the first-type conductivity refers to P-type conductivity and the second-type conductivity refers to N-type conductivity; whereas, if the BJT is a PNP-type BJT, then the first-type conductivity refers to N-type conductivity and the second-type conductivity refers to P-type conductivity. See the detailed discussion below regarding different dopants that can be employed in semiconductor materials to achieve P-type conductivity or N-type conductivity.

In any case, the collector region 120 can include at least one dopant implant region in the device area at the top surface of the semiconductor substrate 101. For example, an exemplary collector region 120 can include a sub-collector region 121 (also referred to herein as a first collector portion) doped with one or more second-type conductivity dopants so as to have a second-type conductivity at a relatively high conductivity level. This sub-collector region 121 can be positioned below the device area and can further extend laterally below the STI regions 105 that surround the device area. The collector region 120 can further include a collector pedestal 122 (also referred to herein as a second collector portion) doped with one or more second-type conductivity dopants (e.g., so as to have the second type conductivity at a lower conductivity level than the sub-collector region 121). The collector pedestal 122 can extend vertically through the device area from the top surface of the semiconductor substrate 101 to the sub-collector region 121. The collector region 120 can further include one or more collector contact regions 123 doped with one or more second-type conductivity dopants so as to have the second type conductivity at the relatively high conductivity level. The collector contact region(s) 123 can, for example, extend vertically from through the STI region(s) 105 to the subs-collector region 121. Thus, for example, in an NPN-type BJT, the sub-collector region 121 can be an N+ sub-collector region, the collector pedestal 122 can be an N collector pedestal, and the collector contact region(s) 123 can be N+ collector contact regions; whereas, in a PNP-type BJT, the sub-collector region 121 can be a P+ sub-collector region, the collector pedestal 122 can be a P collector pedestal, and the collector contact region(s) 123 can be P+ collector contact regions.

It should be understood that the exemplary collector region 120 described above and illustrated in the figures is provided for illustration purposes. Various different configurations for an in-substrate collector region are well known in the art (e.g., a single collector region adjacent to the top surface of the substrate, etc.) and any of these configurations could, alternatively, be incorporated into the embodiments disclosed herein.

The base region 130 can include a base layer 135. The base layer 135 can be an epitaxial semiconductor layer, which is, for example, non-selectively grown on the top surface of the semiconductor substrate 101 and further on the adjacent STI regions 105 and/or an optional polysilicon layer on the STI regions 105. Thus, the base layer 135 can have a monocrystalline first base portion 131 above the semiconductor substrate 101 and polycrystalline second base portions 132 on opposing sides of the first base portion 131. It should be noted that the base layer 135 can be patterned so that it does not extend laterally over the collector contact region(s) 123. The first base portion 131 can be undoped (e.g., such that it is an intrinsic base portion) or, alternatively, can be doped with one or more first-type conductivity dopants so as to have the first-type conductivity at a relatively low conductivity level. The second base portions 132 can be doped with one or more first-type conductivity dopants so as to have the first-type conductivity at a relatively high conductivity level (e.g., such that they are extrinsic base portions). Thus, for example, in an NPN-type BJT, the first base portion 131 can be an intrinsic base portion and the second base portions 132 can be N+ extrinsic base portions; whereas, in a PNP-type BJT, the first base portion 131 can be an intrinsic base portion and the second base portions 132 can be P+ extrinsic base portions. In some embodiments, the BJT can be a non-heterojunction BJT with the base layer 135 being the same semiconductor material as the collector region (e.g., silicon). In other embodiments, the BJT can be an HBT with the base layer 135 being a different semiconductor material (e.g., silicon germanium) than that of the collector region (e.g., silicon).

The emitter region 140 can be within an emitter stack on the first base portion 131. The emitter stack can include an isolation layer 161 covering the top surface of the base layer 135. The isolation layer 161 can include a first isolation portion on the first base portion 131 and second isolation portions on the second base portions 132. Optionally, the first isolation portion can be relatively thick as compared to the second isolation portions. That is, the portion of the isolation layer 161 above the second base portions 132 can relative thin as compared to the portion of the isolation layer 161 above the first base portion 131. The isolation layer 161 can be, for example, a silicon dioxide layer or some other suitable isolation layer. It should be noted that the material selected for the isolation layer (as well as the thickness of the second isolation portions) should be such that, during processing, dopants can be implanted through the isolation layer 161 into the second base portions 132 (i.e., to form the extrinsic base portions, as discussed above).

The emitter stack can further include a dielectric layer 162 on the first isolation portion. The dielectric layer 162 can be made of a different material than the isolation layer 161. For example, if the isolation layer 161 is a silicon dioxide layer, then the dielectric layer 162 can be a silicon nitride layer, a silicon oxynitride layer, or a layer of some other suitable dielectric material. The dielectric layer 162 can be aligned above the first isolation portion and the first base portion 131 below only (i.e., it does not also extend laterally over the second isolation portions and the second base portions 132 below).

The emitter stack can further include an emitter opening, which extends essentially vertically through the dielectric layer 162 and the first isolation portion of the isolation layer 161 to the first base portion 131 of the base region 130. As illustrated, the emitter opening can have a first width (W1) that is less than a second width (W2) of the dielectric layer 162 and the first isolation portion of the isolation layer 161 below.

The emitter stack can further include an emitter region 140. The emitter region 140 can include an emitter layer 145. The emitter layer 145 can be a non-selectively grown epitaxial semiconductor layer (e.g., a polysilicon layer). The emitter layer 145 can be in situ doped with one or more second-type conductivity dopants so as to have the second-type conductivity at a relatively high conductivity level. Thus, for example, in an NPN-type BJT, the emitter layer 145 can be an N+ emitter layer; whereas, in a PNP-type BJT, the emitter layer 145 can be a P+ emitter layer. In any case, the emitter layer 145 can include a first emitter portion 141 and a second emitter portion 142. The first emitter portion 141 can fill the emitter opening and, thus, can extend essentially vertically through the dielectric layer 162 and the isolation layer 161 to the first base portion 131 and can the same first width (W1). The second emitter portion 142 can be on and wider than the first emitter portion 141 such that it extends laterally onto the top surface of the dielectric layer 162.

The emitter stack can further an additional dielectric layer 163 on the top surface of the second emitter portion 142. The additional dielectric layer 163 can be made of a different material than the isolation layer 161 and either the same or a different dielectric material than the dielectric layer 162. Specifically, the additional dielectric layer 163 can be made of a dielectric material that is suitable for protecting the second emitter portion 142 from a dopant implantation process performed during process to ensure that the second base portions 132 have the first-type conductivity. Thus, for example, the additional dielectric layer 163 could be a silicon nitride layer, a silicon oxynitride layer or a layer of some other suitable dielectric material. The additional dielectric layer 163 can further have sidewalls that are vertically aligned with the sidewalls of the dielectric layer 162 and the first isolation portion of the isolation layer 161 below such that the additional dielectric layer 163 has the same second width (W2).

In each of the embodiments, at least a section of the second emitter portion 142 can be narrower in width than the dielectric layer 162 and the additional dielectric layer 163, thereby creating cavities 146 that are positioned vertically between edge portions of the dielectric and additional dielectric layers 162-163 and further positioned laterally adjacent to the sidewalls of the second emitter portion 142. Depending upon the method techniques used to form the semiconductor structure and, particularly, the emitter region 140 of the BJT (as discussed in greater detail below with regard to the method embodiments), the shape of the second emitter portion 142 and, thereby the shape of these cavities 146 can vary.

For example, as a result of processing (described in greater detail below with regard to the method embodiments), in some embodiments, the entire second emitter portion 142 could be narrower in width than the dielectric and additional dielectric layers 162-163 (e.g., see the second emitter portion 142 in the BJTs 110.1A and 110.1B of the semiconductor structures 100.1A and 100.1B of FIGS. 1.1A and 1.1B, respectively). As illustrated, the sidewalls of the second emitter portion 142 can be essentially vertical from the dielectric layer 162 to the additional dielectric layer 163 such that the second emitter portion 142 has an essentially uniform width. Alternatively, the sidewalls of the second emitter portion 142 could be curved (e.g., convex or concave) as opposed to linear.

As a result of alternative processing (also described in greater detail below with regard to the method embodiments), in other embodiments, at least a lower section of second emitter portion 142 can be narrower in width that the dielectric and additional dielectric layers 162-163 and the width of the second emitter portion 142 can increase between the dielectric layer 162 and the additional dielectric layer 163 (e.g., see the second emitter portion 142 in the BJTs 110.2A and 110.2B of the semiconductor structures 100.2A and 100.2B of FIGS. 1.2A and 1.2B, respectively). As illustrated, the sidewalls of the second emitter portion 142 may be angled and linear such that the second emitter portion 142 increases in width between the dielectric layer 162 and the additional dielectric layer 163 and such that, optionally, the top surface of the second emitter portion 142 has the same second width (W2) as the dielectric and additional dielectric layers 162-163. Alternatively, the sidewalls of the second emitter portion 142 could be curved as opposed to linear.

In any case, these cavities 146 can be filled with dielectric material(s) or dielectric material(s) can block the side openings to the cavities 146 creating, within the cavities, pockets 165 of air, of gas or under vacuum. For example, optionally, the semiconductor structure 100.1A, 100.1B, 100.2A, and 100.2B can include a conformal etch stop layer 171. This etch stop layer 171 can be, for example, a thin conformal silicon nitride layer or a thin conformal layer of some other suitable dielectric etch stop material. The etch stop layer 171 can portions of the BJT above the semiconductor substrate. For example, as illustrated, the etch stop layer 171 can cover the top surface and sidewalls of the additional dielectric layer 163, can line the cavities 146, can cover the vertically aligned sidewalls of the dielectric layer 162 and first isolation portion below, can cover the top surface of the second isolation portion, can cover the vertically aligned sidewalls of the second isolation portion, the second base portions 132, and optional polysilicon layer, and can further extend laterally over the collector contact region(s) 123. The semiconductor structure 100.1A, 100.1B, 100.2A, and 100.2B can further include one or more layers of interlay dielectric (ILD) material 172 on the BJT. The ILD material 172 can be, for example, silicon dioxide, doped silicon glass (e.g., phosphosilicate glass (PSG) or borophosphosilicate glass (BPSG)), or any other suitable ILD material. In some embodiments, the ILD material 172 can fill the remaining space in the cavities 146 (e.g., see the second emitter portion 142 in the BJTs 110.1A and 110.2A of the semiconductor structures 100.2A and 100.2A of FIGS. 1.1A and 1.2A, respectively). In other embodiments, the ILD material 172 can block the side openings to the cavities 146 creating, in the cavities, pockets 165 of air, of gas or under vacuum (e.g., see the second emitter portion 142 in the BJTs 110.1B and 110.2B of the semiconductor structures 100.2B and 100.2B of FIGS. 1.1B and 1.2B, respectively).

In the above-described semiconductor structures 100.1A, 100.1B, 100.2A, and 100.2B, the cavities 146, which are filled with dielectric material or which contain a pocket 165 of air, of gas or under vacuum, cause a decrease in the Cbe of the BJT 110.1A, 110.1B, 110.2A, 110.2B and a corresponding increase in the cut-off frequency (fT) without also causing changes in the overall BJT size, the maximum oscillation frequency (fmax), the collector-base capacitance (Ccb) or the breakdown voltage (BV) (including the emitter-base breakdown voltage (BVebo).

Referring to the flow diagram of FIG. 2, also disclosed herein are method embodiments for forming a semiconductor structure, such as any of the semiconductor structures 100.1A, 100.1B, 100.2A, and 100.2B of FIGS. 1.1A, 1.1B, 1.2A and 1.2B, respectively, described in detail above.

Figure 3:
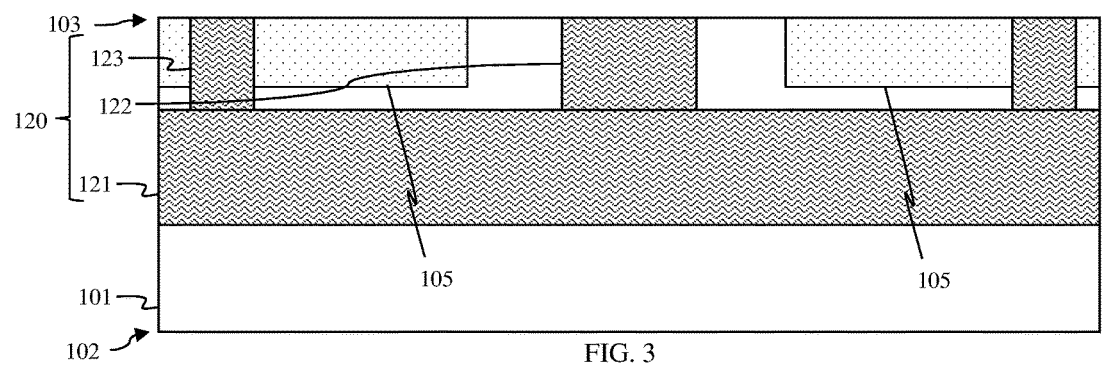
FIGS. 3-10 are cross-section diagrams illustrating partially completed semiconductor structures formed according to the flow diagram of FIG. 2.

The method can begin with a monocrystalline semiconductor substrate 101 (e.g., a monocrystalline silicon substrate or a monocrystalline substrate of any other suitable semiconductor material) (see process 202 and FIG. 3). The monocrystalline semiconductor substrate 101 can, for example, be doped with one or more P-type dopant(s) such that it has a P-type conductivity at a relatively low conductivity level (e.g., such that the substrate 101 is a P-substrate). The semiconductor substrate 101 can have a first surface 102 (also referred to herein as a bottom surface) and a second surface 103 (also referred to herein as a top surface) opposite the first surface 102. For illustration purposes, the monocrystalline semiconductor substrate 101 is shown in FIG. 3 as being a bulk semiconductor substrate. However, it should be understood that the monocrystalline semiconductor substrate 101 could, alternatively, be a monocrystalline semiconductor layer of a semiconductor-on-insulator structure (e.g., a silicon layer of a silicon-on-insulator (SOI) structure).

The method can further include forming, on the substrate, a vertical bipolar junction transistor (BJT) with reduced base-emitter capacitance (Cbe) and increased cut-off frequency (fT) (see process 204). The BJT formed at process 204 can be a non-heterojunction BJT or, alternatively, a high performance heterojunction bipolar transistor (HBT).

To form such a BJT at process 204, the method can include forming trench isolation regions, such as shallow trench isolation (STI) regions 105, at the top surface 103 of the semiconductor substrate 101 (see process 206 and FIG. 3). The STI regions 105 can be formed using conventional processing techniques. That is, trenches can be formed (e.g., lithographically patterned and etched such that they extend into the semiconductor substrate 101 from the top surface 103. The trenches can subsequently be filled with one or more isolation materials (e.g., silicon dioxide or any other suitable isolation material(s)) and a polishing process (e.g., a conventional chemical mechanical polishing (CMP) process) can be performed in order to remove any isolation material from the top surface 103 of the semiconductor substrate 101. It should be noted that patterning of the trenches should be performed such that at least some of the STI regions 105 define (laterally surround) a device area in the substrate for the BJT.

It should be noted that in the discussion of subsequent processing steps reference is made to semiconductor layers and/or regions that are doped so as to have a first-type conductivity or a second-type conductivity that is different from the first-type conductivity. It should be understood that the first-type conductivity and the second-type conductivity are either P-type conductivity and N-type conductivity, respectively, or N-type conductivity and P-type conductivity, respectively, depending upon whether the BJT is an NPN-type BJT or a PNP-type BJT. Specifically, if the BJT is an NPN-type BJT, then the first-type conductivity refers to P-type conductivity and the second-type conductivity refers to N-type conductivity; whereas, if the BJT is a PNP-type BJT, then the first-type conductivity refers to N-type conductivity and the second-type conductivity refers to P-type conductivity. See the detailed discussion below regarding different dopants that can be employed in semiconductor materials to achieve P-type conductivity or N-type conductivity.

In any case, the method can include forming a collector region 120 in the semiconductor substrate 101 (see process 208 and FIG. 3). Formation of the collector region 120 can include the performance of at least one masked dopant implantation process so as to form at least one dopant implant region in the device area at the top surface of the semiconductor substrate 101. For example, a masked dopant implantation process can be performed so as to form a sub-collector region 121 (also referred to herein as a first collector portion). This dopant implantation process can be performed so that the sub-collector region 121 is doped with one or more second-type conductivity dopants so as to have a second-type conductivity at a relatively high conductivity level and further so that the sub-collector region 121 is positioned below the device area and extends laterally below the STI regions 105 that surround the device area. Formation of the collector region 120 can further include the performance of another masked dopant implantation process so as to form a collector pedestal 122 (also referred to herein as a second collector portion). This dopant implantation process can be performed so that the collector pedestal 122 is doped with one or more second-type conductivity dopants (e.g., so as to have the second type conductivity at a lower conductivity level than the sub-collector region 121) and so that the collector pedestal 122 extends vertically through the device area from the top surface of the semiconductor substrate 101 to the sub-collector region 121. Formation of the collector region 120 can further include yet another process to form one or more collector contact regions 123, which are doped with one or more second-type conductivity dopants so as to have the second type conductivity at the relatively high conductivity level and which extend vertically from through the STI region(s) 105 to the subs-collector region 121. Thus, for example, in an NPN-type BJT, the sub-collector region 121 can be formed as an N+ sub-collector region, the collector pedestal 122 can be formed as an N collector pedestal, and the collector contact region(s) 123 can be formed as N+ collector contact regions; whereas, in a PNP-type BJT, the sub-collector region 121 can be formed as a P+ sub-collector region, the collector pedestal 122 can be formed as a P collector pedestal, and the collector contact region(s) 123 can be formed as P+ collector contact regions.

It should be understood that exemplary processes described above for forming a collector region 120 at process 208 are provided for illustration purposes. Alternatively, any other suitable process steps for forming an in-substrate collector region could be performed at process 208.

Figure 4:
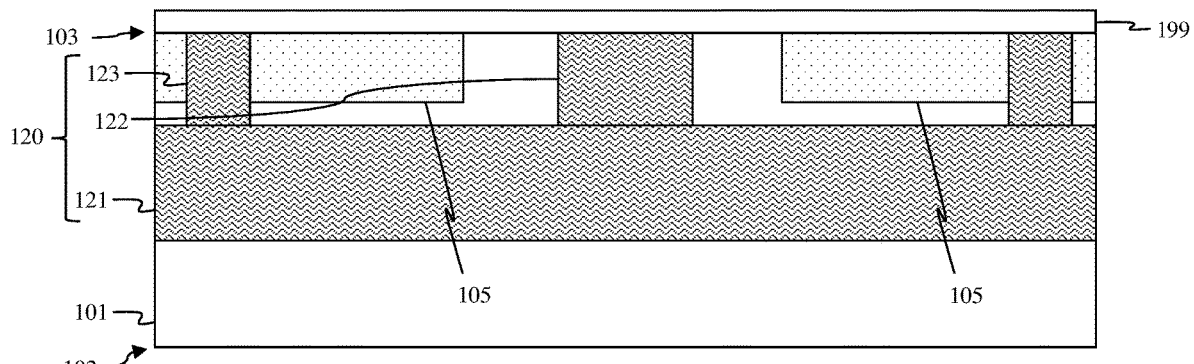
Figure 5:
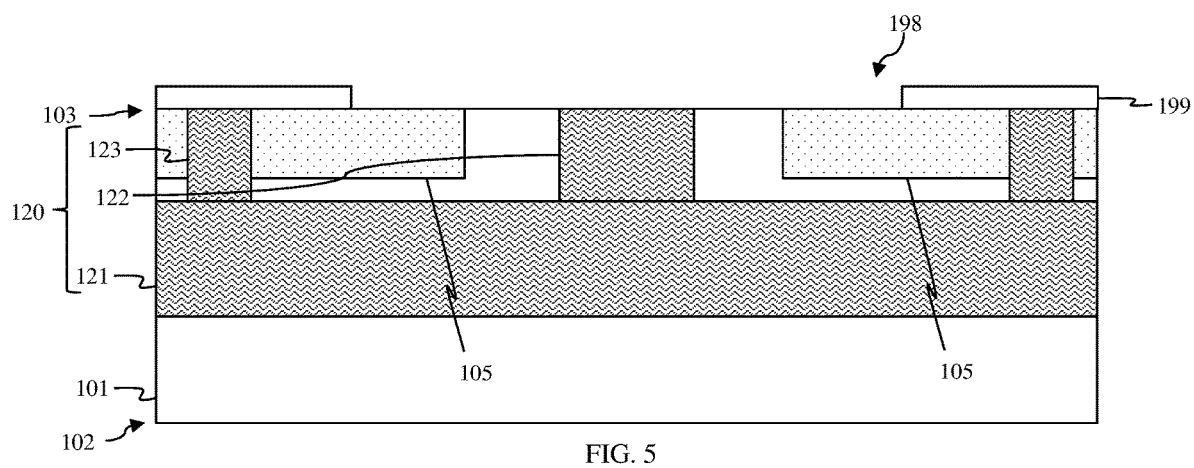

Optionally, the method can include forming a polysilicon layer 199 on the top surface 103 of the semiconductor substrate 101 and over the device area and adjacent STI regions 105 (see FIG. 4) and further forming a base opening 198 in the polysilicon layer 199 (see FIG. 5). The base opening 198 can, for example, be lithographically patterned and etch so as to expose the top surface 103 of the semiconductor substrate 101 in the device area and so as to expose portions of the top surface of the STI region 105 immediately adjacent to the device area.

Figure 6:
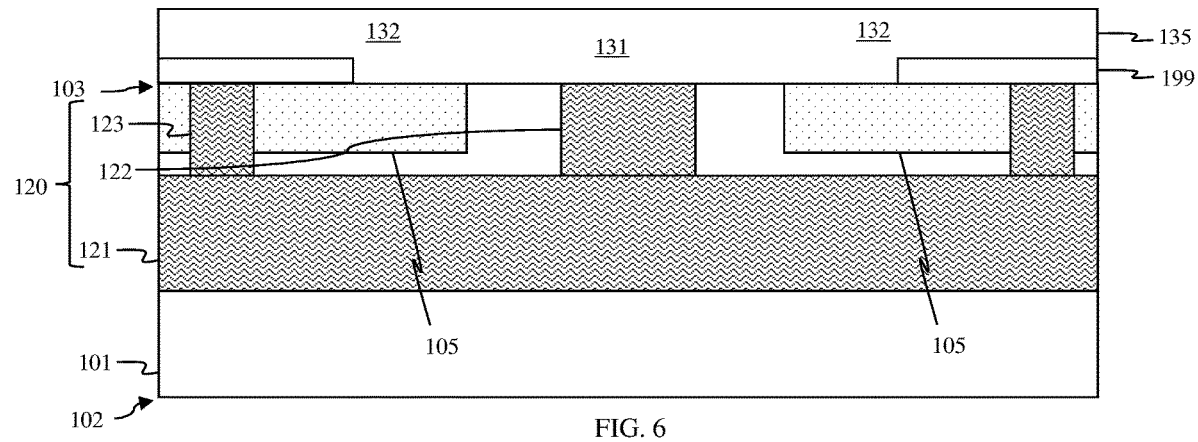

The method can further include forming a base layer 135 for a base region 130 (see process 210 and FIG. 6). The base layer 135 can be an epitaxial semiconductor layer, which is, for example, non-selectively grown on the top surface of the semiconductor substrate 101 (e.g., in the base opening 198 (if present) and further on the exposed top surfaces of the adjacent STI regions 105 and the polysilicon layer 199 (if present). Thus, the base layer 135 can have a monocrystalline first base portion 131 above and immediately adjacent to the semiconductor substrate 101 (e.g., at the collector pedestal 122) and polycrystalline second base portions 132 on opposing sides of the first base portion 131 (i.e., above the STI regions/polysilicon layer). The base layer 135 can be undoped (e.g., such that it is an intrinsic base portion) or, alternatively, can be in situ doped with one or more first-type conductivity dopants so as to have the first-type conductivity at a relatively low conductivity level. Thus, for example, when forming an NPN-type BJT, the base layer 135 formed at process 210 can be an intrinsic base layer or P-base layer; whereas, when forming a PNP-type BJT, the base layer 135 formed at process 210 can be an intrinsic base layer or an N-base layer. Additionally, when forming a non-heterojunction BJT, the base layer 135 formed at process 210 can be made of the same semiconductor material as the collector region (e.g., silicon); whereas, when forming an HBT, the base layer 135 formed at process 210 can be made of a different semiconductor material (e.g., silicon germanium) than that of the collector region (e.g., silicon).

Figure 7:
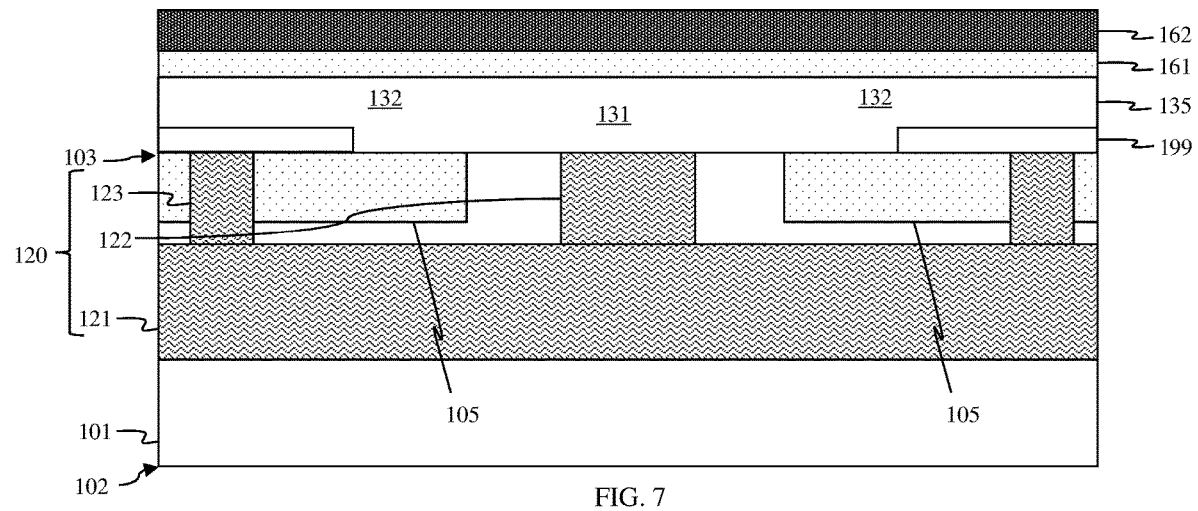

The method can further include forming (e.g., depositing or otherwise forming) an isolation layer 161 on the top surface of the base layer 135 (see process 212 and FIG. 7). The isolation layer 161 can be, for example, a silicon dioxide layer or some other suitable isolation layer.

The method can further include forming (e.g., depositing) a dielectric layer 162 on the isolation layer 161 (see process 214 and FIG. 7). The dielectric layer 162 can be made of a different material than the isolation layer 161. For example, if the isolation layer 161 is a silicon dioxide layer, then the dielectric layer 162 can be a silicon nitride layer, a silicon oxynitride layer, or a layer of some other suitable dielectric material.

Figure 8:
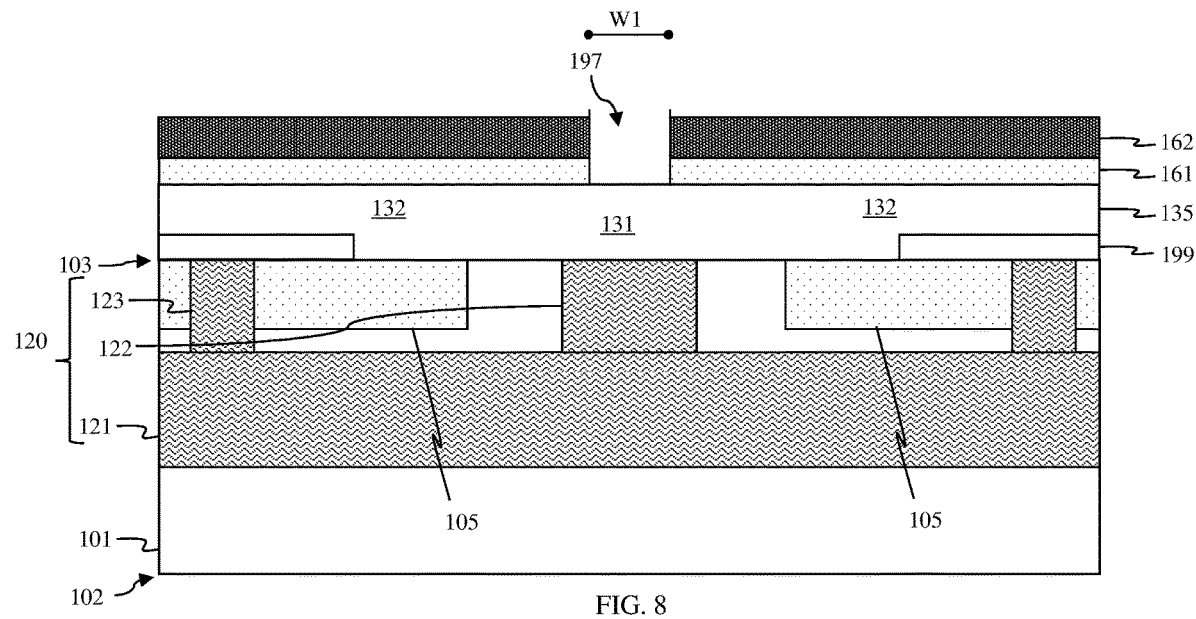

The method can further include forming an emitter opening 197 (see process 216 and FIG. 8). The emitter opening 197 can, for example, be lithographically patterned and etched so that it extends essentially vertically through the dielectric layer 162 and the isolation layer 161 to the first base portion 131. As illustrated, the emitter opening can be patterned and etched so as to have a first width (W1).

Figure 9:
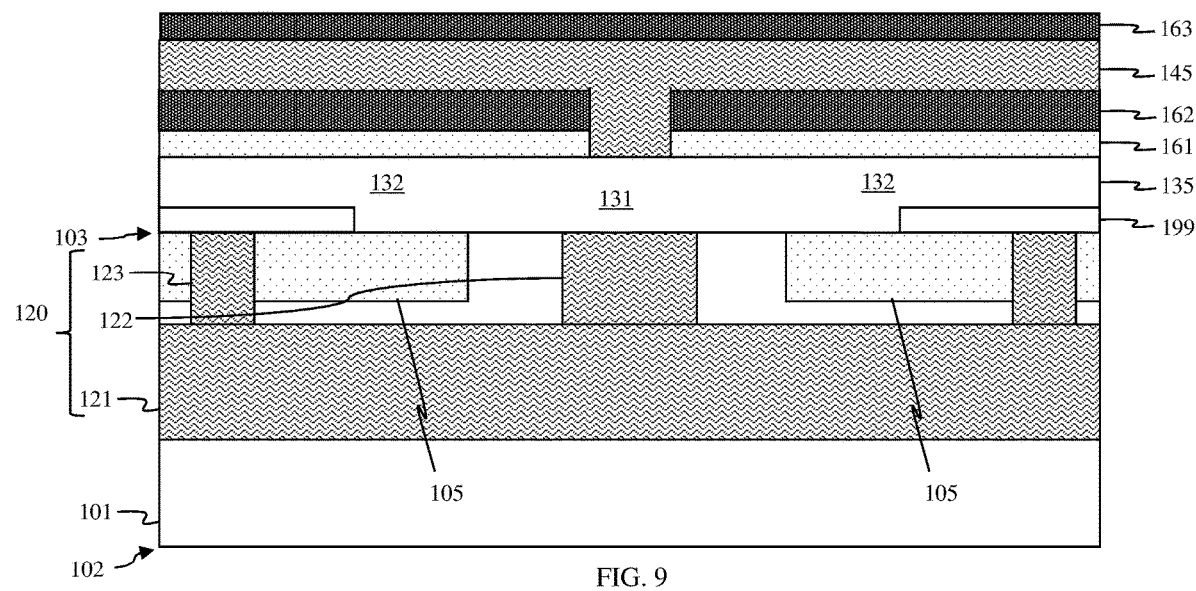

The method can further include forming an emitter layer 145 for an emitter region 140 (see process 218 and FIG. 9). The emitter layer 145 can be a non-selectively grown epitaxial semiconductor layer (e.g., a polysilicon layer). The emitter layer 145 can be in situ doped with one or more second-type conductivity dopants so as to have the second-type conductivity at a relatively high conductivity level. Thus, for example, in an NPN-type BJT, the emitter layer 145 can be an N+ emitter layer; whereas, in a PNP-type BJT, the emitter layer 145 can be a P+ emitter layer. In any case, the emitter layer 145 can be deposited so as to form, for the emitter region 140, a first emitter portion 141 and a second emitter portion 142. The first emitter portion 141 can fill the emitter opening and, thus, can extend essentially vertically through the dielectric layer 162 and the isolation layer 161 to the first base portion 131 and can the same first width (W1). The second emitter portion 142 can be on and wider than the first emitter portion 141 such that it extends laterally onto and covers the top surface of the dielectric layer 162.

The method can further include forming (e.g., depositing) an additional dielectric layer 163 on the top surface of the emitter layer 145 (see process 220 and FIG. 9). The additional dielectric layer 163 can be made of a different material than the isolation layer 161 and either the same or a different dielectric material than the dielectric layer 162. Specifically, the additional dielectric layer 163 can be made of a dielectric material that is suitable for protecting the second emitter portion 142 from a dopant implantation process performed at process 224, disclosed below. Thus, for example, the additional dielectric layer 163 could be a silicon nitride layer, a silicon oxynitride layer or a layer of some other suitable dielectric material.

Figure 10:
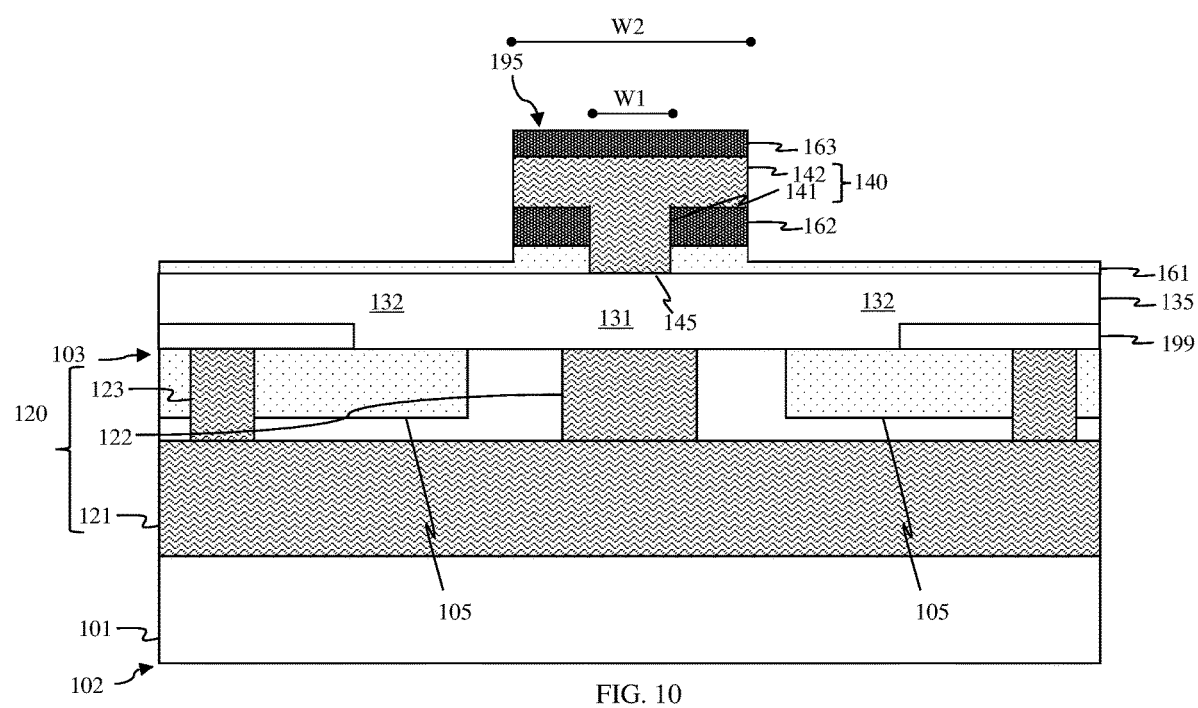

The method can further include forming an emitter stack 195, from the layers formed at processes 212-220 (see process 222 and FIG. 10). For example, a mask layer can be formed on the top surface of the additional dielectric layer 163. This mask layer can be made of a different material than the additional dielectric layer 163. The mask layer can be lithographically patterned and etched so as to form a patterned mask on the top surface of the additional dielectric layer, aligned above the emitter opening (i.e., the first emitter portion 141) and having a second width (W2) that is wider than the first width (W1) of the emitter opening. One or more anisotropic etch processes can subsequently be performed to remove exposed portions of the additional dielectric layer 163, the emitter layer 145, and the dielectric layer 162, thereby forming the emitter stack 195. The anisotropic etch processes can optionally etch into, but not completely through, the isolation layer 161 such that the polycrystalline second base portions 132 remain covered at least by thin portions of the isolation layer 161. That is, in this case, the isolation layer 161 will have a first isolation portion, which is relatively thick and within the emitter stack 195, and second isolation portions, which extend laterally beyond essentially vertically aligned sidewalls of the emitter stack 195 and which cover the second base portions 132. The mask can then be selectively removed.

Following emitter stack formation, a dopant implantation process can be performed in order to implant one or more first-type conductivity dopants into the second base portions 132 (e.g., through the thin portions of the isolation layer 161) (see process 224). It should be noted that this dopant implantation process can be performed so that the second base portions 132 will have the first-type conductivity at a relatively high conductivity level. For example, if an NPN-type BJT is being formed, process 224 can be performed so that the second base portions 132 are P+ second base portions; whereas, if a PNP-type BJT is being formed, process 224 can be performed so that the second base portions 132 are N+ second base portions.

In some embodiments, process 224 can be performed using a 0-degree tilt angle when implanting the second base portions 132 with first-type conductivity dopant(s) so that the entire second emitter portion 142 remains protected by the additional dielectric layer 163 (see FIG. 11.1). In other embodiments, process 224 can be performed using a 5 to 40-degree title angle and further rotating the wafer when implanting the second base portions 132 with first-type conductivity dopant(s) so that at least some areas 194 of the edge portions of the second emitter portion 142 at least in the bottom corners close to the dielectric layer 162 also become doped with the first-type conductivity dopant(s)(see FIGS. 11.2(1) and 11.2(2)).

The exposed sidewalls of the second emitter portion 142 can then be etched back so at least a section of the second emitter portion 142 is narrower in width than the dielectric layer 162 and the additional dielectric layer 163 and so that, as a result, cavities 146 are formed (see process 226). Specifically, the cavities 146 formed at process 226 can be positioned vertically between edge portions of the dielectric and additional dielectric layers 162-163 and positioned laterally adjacent to the sidewalls of the second emitter portion 142. The shape of the second emitter portion 142 and, thereby the shape of these cavities 146 can vary depending upon the tilt angle used for process 224 and the etch specification used at process 226.

For example, if a 0-degree tilt angle was used at process 224 when implanting the second base portions 132 with first-type conductivity dopant(s), the second emitter portion will be devoid of any of the first-type conductivity dopants. In this case, at process 226, an isotropic etch process that is selective to the second-type conductivity semiconductor material of the second emitter portion 142 can be performed and timed so as to stop before the width of the second emitter portion becomes less than the first width (W1) (see FIG. 12.1). As a result, the sidewalls of the second emitter portion 142 could remain essentially vertical and the second emitter portion 142 could have an essentially uniform width, as illustrated. Alternatively, the etch rate of the second-type conductive semiconductor material could be different at the middle of the sidewalls as compared to at the interface with the dielectric layers above and below and, as a result, the sidewalls of the second emitter portion 142 could, alternatively, be curved (e.g., convex or concave) as opposed to linear.

If, however, some tilt angle (e.g., a tilt angle between 5 and 40 degrees) was used at process 224 when implanting the second base portions 132 with first-type conductivity dopant(s), then the second emitter portion 142 will included doped areas 194 at least in the bottom corners. Those skilled in the art will recognize that the size of the doped areas 194 will be larger in the case of a larger tilt angle used at process 224 and vice versa. In any case, the doped areas 194 can be etched away at process 226 using an isotropic etch selective to the first-type conductivity semiconductor material of the doped areas 194 over the second-type conductivity semiconductor material of the undoped areas (see FIG. 12.2). As a result, the second emitter portion 142 increases in width between the dielectric layer 162 and the additional dielectric layer 163, as illustrated. Also, as a result, the sidewalls of at least a lower section of the second emitter portion 142 can be angled and linear and the top surface of the second emitter portion 142 may have the same second width (W2) as the dielectric and additional dielectric layers 162-163, as illustrated. Alternatively, due to the shape of the doped area and/or the etch specifications used, the sidewalls of at least the lower section may be curved as opposed to linear.

Additional BJT processing can include, for example, patterning the second base portions 132 (see process 228 and FIGS. 1.1A-1.2B). Patterning of the second base portions can, for example, be performed so as to expose the collector contact region(s) 123.

Middle of the line (MOL) processing can subsequently be performed (see process 230 and FIGS. 1.1A-1.2B). This MOL processing can include, for example, covering the partially completed structure with dielectric material(s). For example, at process 230, a conformal etch stop layer 171 (e.g., a thin conformal silicon nitride layer or a thin conformal layer of some other suitable dielectric etch stop material) can be deposited over the partially completed structure. As illustrated, the etch stop layer 171 can cover the top surface and sidewalls of the additional dielectric layer 1163, can line the cavities 146, can cover the vertically aligned sidewalls of the dielectric layer 162 and first isolation portion below, can cover the top surface of the second isolation portion, can cover the vertically aligned sidewalls of the second isolation portion, the second base portions 132, and optional polysilicon layer, and can further extend laterally over the collector contact region(s) 123. Then, one or more layers of interlay dielectric (ILD) material 172 can be deposited. The ILD material 172 can be, for example, silicon dioxide, doped silicon glass (e.g., phosphosilicate glass (PSG) or borophosphosilicate glass (BPSG)), or any other suitable ILD material. This ILD material 172 can, for example, be deposited so that it fills the remaining space in the cavities 146 (e.g., see the second emitter portion 142 in the BJTs 110.1A and 110.2A of the semiconductor structures 100.2A and 100.2A of FIGS. 1.1A and 1.2A, respectively) or, alternatively, so that it blocks the side openings to the cavities 146 creating, in the cavities, pockets 165 of air, of gas or under vacuum (e.g., see the second emitter portion 142 in the BJTs 110.1B and 110.2B of the semiconductor structures 100.2B and 100.2B of FIGS. 1.1B and 1.2B, respectively). It should be understood that MOL processing can also include the formation of MOL contacts (not shown) extending through the ILD material and etch stop layer to the collector contact region(s) 123, to the second base portions 132, and to the second emitter portion 142.

In the structure and method embodiments described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base semiconductor material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The method embodiments described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a dielectric layer;
an emitter region comprising:
   a first emitter portion extending through the dielectric layer; and
   a second emitter portion on the first emitter portion and further extending laterally onto the dielectric layer;
an additional dielectric layer on the second emitter portion;
a base region comprising a first base portion and second base portions, wherein the first base portion is positioned laterally between the second base portions; and
an isolation layer on the base region, the isolation layer including a first isolation portion on the first base portion and second isolation portions on the second base portions, wherein the dielectric layer is on the first isolation portion of the isolation layer and aligned above the first base portion, and wherein the first emitter portion extends through the dielectric layer and the first isolation portion of the isolation layer to the first base portion,
wherein the dielectric layer, the second emitter portion, and the additional dielectric layer are wider than the first emitter portion, and
wherein at least a section of the second emitter portion is narrower than the dielectric layer and the additional dielectric layer.

2. The semiconductor structure of claim 1, further comprising a dielectric material that one of:
fills cavities between edge portions of the dielectric layer and the additional dielectric layer and positioned laterally adjacent to sidewalls of the second emitter portion; and
blocks side openings to the cavities creating, in the cavities, pockets of air, of gas or under vacuum.

3. The semiconductor structure of claim 1, further comprising an etch stop layer lining cavities between edge portions of the dielectric layer and the additional dielectric layer and positioned laterally adjacent to sidewalls of the second emitter portion.

4. The semiconductor structure of claim 1, wherein the first isolation portion of the isolation layer is thicker than the second isolation portions of the isolation layer.

5. The semiconductor structure of claim 1, further comprising:
a semiconductor substrate having a first surface and a second surface opposite the first surface;
isolation regions in the semiconductor substrate at the second surface, wherein the first base portion is on the second surface and wherein the second base portions extend laterally over the isolation regions;
a collector region in the semiconductor substrate and comprising:
   a first collector portion between the first surface and the second surface, wherein the first collector portion is aligned below the first base portion and extends laterally below the isolation regions; and
   a second collector portion extending from the first collector portion to the first base portion at the second surface.

6. A semiconductor structure comprising:
a dielectric layer;
an emitter region comprising:
   a first emitter portion extending through the dielectric layer; and
   a second emitter portion on the first emitter portion and further extending laterally onto the dielectric layer;
an additional dielectric layer on the second emitter portion;
a base region comprising a first base portion and second base portions, wherein the first base portion is positioned laterally between the second base portions; and
an isolation layer on the base region, the isolation layer including a first isolation portion on the first base portion and second isolation portions on the second base portions, wherein the dielectric layer is on the first isolation portion of the isolation layer and aligned above the first base portion, and wherein the first emitter portion extends through the dielectric layer and the first isolation portion of the isolation layer to the first base portion,
wherein the dielectric layer, the second emitter portion, and the additional dielectric layer are wider than the first emitter portion, and
wherein at least a section of the second emitter portion is narrower than the dielectric layer and the additional dielectric layer and increases in width between the dielectric layer and the additional dielectric layer.

7. The semiconductor structure of claim 6, wherein a top surface of the second emitter portion, the dielectric layer, and the additional dielectric layer have approximately equal widths.

8. The semiconductor structure of claim 6, further comprising a dielectric material that one of:
fills cavities between edge portions of the dielectric layer and the additional dielectric layer and positioned laterally adjacent to sidewalls of the second emitter portion; and
blocks side openings to the cavities creating, in the cavities, pockets of air, of gas or under vacuum.

9. The semiconductor structure of claim 6, further comprising an etch stop layer lining cavities between edge portions of the dielectric layer and the additional dielectric layer and positioned laterally adjacent to sidewalls of the second emitter portion.

10. The semiconductor structure of claim 6, wherein the first isolation portion is thicker than the second isolation portions.

11. The semiconductor structure of claim 6, further comprising:
a semiconductor substrate having a first surface and a second surface opposite the first surface;
isolation regions in the semiconductor substrate at the second surface, wherein the first base portion is on the second surface and wherein the second base portions extend laterally over the isolation regions;
a collector region in the semiconductor substrate and comprising:
   a first collector portion between the first surface and the second surface, wherein the first collector portion is aligned below the first base portion and extends laterally below the isolation regions; and
   a second collector portion extending from the first collector portion to the first base portion at the second surface.

12. A method comprising:
forming a base layer on a semiconductor substrate, the base region including a first base portion and second base portions, wherein the first base portion is positioned laterally between the second base portions;
forming an isolation layer on the base region, the isolation layer including a first isolation portion on the first base portion and second isolation portions on the second base portions;
forming an emitter stack comprising:
   a dielectric layer, wherein the dielectric layer is on the first isolation portion of the isolation layer and aligned above the first base portion;
   an emitter region comprising:
      a first emitter portion extending through the dielectric layer, wherein the first emitter portion extends through the dielectric layer and the first isolation portion of the isolation layer to the first base portion; and
      a second emitter portion on the first emitter portion and further extending laterally onto the dielectric layer; and
   an additional dielectric layer on the second emitter portion,
   wherein the dielectric layer, the second emitter portion, and the additional dielectric layer are wider than the first emitter portion, and
   wherein at least a section of the second emitter portion is narrower than the dielectric layer and the additional dielectric layer; and
covering the emitter stack with dielectric material.

13. The method of claim 12, wherein the forming of the emitter stack further comprises:
forming the dielectric layer;
forming an emitter opening extending through the dielectric layer and the first isolation portion of the isolation layer, wherein the emitter opening has a first width;
forming an emitter layer in the emitter opening and on the dielectric layer;
forming the additional dielectric layer on the emitter layer,
forming a mask on the additional dielectric layer;
performing anisotropic etch processes to etch through the additional dielectric layer, the emitter layer, and the dielectric layer; and
etching back sidewalls of the second emitter portion.

14. The method of claim 13, further comprising:
forming a collector region in the semiconductor substrate, wherein the base layer is formed adjacent to the collector region;
performing a dopant implant process to dope the second base portions of the base layer, wherein the second base portions extend laterally beyond vertically aligned sidewalls of the stack, and wherein the dopant implant process is performed before the etching back of the sidewalls of the second emitter portion.

15. The method of claim 14, wherein the performing of the dopant implant process comprises using a 0 degree tilt angle and wherein the etching back of the sidewalls of the second emitter portion comprises performing a timed isotropic etch process selective to a semiconductor material of the second emitter portion.

16. The method of claim 14, wherein the performing of the dopant implant process comprises using a tilt angle of between 5 and 40 degrees so that a dopant is also implanted at an angle into edge portions of the second emitter portion through the sidewalls and wherein the etching back of the sidewalls comprises performing an isotropic etch process selective to only areas of a semiconductor material of the second emitter portion doped with the dopant.

17. The method of claim 12, wherein the covering of the emitter stack with the dielectric material is performed so that the dielectric material one of:
fills cavities between edge portions of the dielectric layer and the additional dielectric layer and positioned laterally adjacent to sidewalls of the second emitter portion; and
blocks side openings to the cavities creating, in the cavities, pockets of air, of gas or under vacuum.

18. The method of claim 12, further comprising forming an etch stop layer to line cavities between edge portions of the dielectric layer and the additional dielectric layer and positioned laterally adjacent to sidewalls of the second emitter portion.

* * * * *